(12) United States Patent
Gillingham et al.

(10) Patent No.: US 8,767,430 B2
(45) Date of Patent: *Jul. 1, 2014

(54) CONFIGURABLE MODULE AND MEMORY SUBSYSTEM

(71) Applicant: MOSAID Technologies Incorporated, Ottawa (CA)

(72) Inventors: Peter Gillingham, Ottawa (CA); Roland Schuetz, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/957,713

(22) Filed: Aug. 2, 2013

(65) Prior Publication Data

US 2013/0322173 A1    Dec. 5, 2013

Related U.S. Application Data

(63) Continuation of application No. 12/770,376, filed on Apr. 29, 2010, now Pat. No. 8,503,211.

(60) Provisional application No. 61/180,693, filed on May 22, 2009.

(51) Int. Cl.
*G11C 5/02* (2006.01)
*G11C 5/00* (2006.01)
*G11C 5/06* (2006.01)
*G11C 8/00* (2006.01)

(52) U.S. Cl.
USPC ............ 365/51; 365/52; 365/63; 365/230.03; 365/230.05

(58) Field of Classification Search
USPC ........................ 365/51, 52, 63, 230.03, 230.05
See application file for complete search history.

(56) References Cited

U.S. PATENT DOCUMENTS 6,034,878 A * 3/2000 Osaka et al. ................ 365/51
6,137,709 A * 10/2000 Boaz et al. .................. 365/51

(Continued)

FOREIGN PATENT DOCUMENTS

JP   2001-027987   1/2001
JP   2002-23900    1/2002

(Continued)

*Primary Examiner* — Trong Phan
(74) *Attorney, Agent, or Firm* — Dennis R. Haszko

(57) ABSTRACT

A configurable memory subsystem includes a memory module with a circuit board having a first and a second memory-containing device (MCD) pair mounted thereto. Each MCD pair has a first MCD in communication with a second MCD. Each MCD has an input port, an output port, and a memory each communicating with a bridge. In response to a command, the bridge transfers at least one of a portion of a data packet from the input port to the output port or to the memory, or transfers a portion of a memory packet from the memory to the output port. A loop-back device receives the command and the data packet form the first MCD pair and transmits the command and data packet to the second MCD pair.

12 Claims, 20 Drawing Sheets

(56) References Cited

U.S. PATENT DOCUMENTS

| | | | | |
|---|---|---|---|---|
| 6,144,576 | A * | 11/2000 | Leddige et al. | 365/51 |
| 6,625,687 | B1 * | 9/2003 | Halbert et al. | 365/51 |
| 6,772,262 | B1 | 8/2004 | Park et al. | |
| 7,106,611 | B2 * | 9/2006 | Lee et al. | 365/51 |
| 7,113,417 | B2 * | 9/2006 | Pochmuller | 365/51 |
| 7,212,423 | B2 * | 5/2007 | Vogt | 365/52 |
| 7,353,316 | B2 * | 4/2008 | Erdmann | 365/52 |
| 7,480,201 | B2 * | 1/2009 | Bartley et al. | 365/52 |
| 7,529,112 | B2 * | 5/2009 | Dreps et al. | 365/51 |
| 2004/0148482 | A1 | 7/2004 | Grundy et al. | |
| 2008/0028160 | A1 | 1/2008 | Bartley et al. | |

FOREIGN PATENT DOCUMENTS

| | | |
|---|---|---|
| JP | 2003-271538 | 9/2003 |
| JP | 2004-062725 | 2/2004 |
| JP | 2004-187312 | 7/2004 |
| JP | 2006-48688 | 2/2006 |
| JP | 2006-268556 | 10/2006 |
| WO | 2008/101246 | 8/2008 |

* cited by examiner

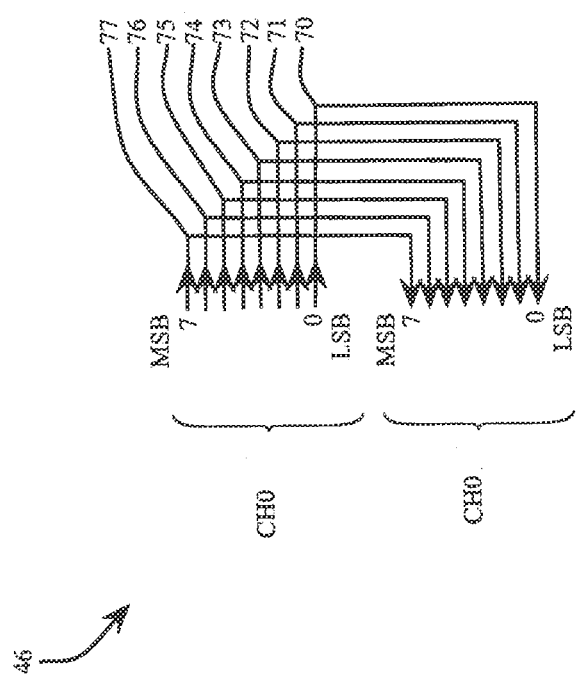

CONFIGURABLE MODULE AND MEMORY SUBSYSTEM

CROSS-REFERENCE TO RELATED APPLICATIONS

This application is a continuation of U.S. application Ser. No. 12/770,376, filed Apr. 29, 2010, now U.S. Pat. No. 8,503,211, which is a utility application claiming priority to U.S. Provisional Application Ser. No. 61/180,693, filed May 22, 2009 entitled "HYPERLINK HLDIMM MODULE AND MEMORY SUBSYSTEM," the entireties of which are incorporated by reference herein.

FIELD OF THE INVENTION

The invention relates generally to memory subsystems. More specifically, the invention relates to a memory subsystem that allows a user to configure the number of memory channels, memory speed, and memory capacity.

BACKGROUND

Many host systems ranging from large enterprise servers to personal computers employ a variety of memory subsystems to provide data for use with a central processing unit (CPU). Host systems often use a hierarchy of memories with different speeds and capacities. Higher capacity memories typically have longer latency and therefore are slower than lower capacity memories. In a typical memory hierarchy a CPU communicates directly with high-speed registers and a cache memory, transferring small amounts of data at a rate comparable to the CPU speed. The cache memory prefetches a larger block of data from a dynamic random access memory (DRAM), but at a rate slower than the CPU speed. The cache takes advantage of the sequential nature of many data requests by the CPU to minimize CPU stalls or situations where the CPU cannot complete a task for lack of necessary data. The DRAM also prefetches a larger block of data from a hard disk drive (HDD). At each level in the hierarchy it is important to prefetch a block of data sufficiently large to compensate for the slower prefetch rate. This permits the average data rate to be maintained at all levels of the hierarchy. HDD memories are significantly slower than DRAMs and other solid-state memories because of their mechanical nature. Preferably each level of memory hierarchy provides several orders of magnitude increase in memory capacity with a single order of magnitude increase in latency. The significant increase in latency between the DRAM and HDD memory hierarchy levels necessitates a memory solution with performance and capacity in between what is available from DRAM and HDD technologies so that data flow is balanced throughout the memory hierarchy.

Conventional memory modules communicate through a shared bus. This results in a high capacitive loading on the shared bus that reduces memory speed. The shared bus approach also creates stubs when memory modules are removed. Stubs are conduction paths that are not terminated with a load, resulting in signal reflections that can require an extended settling time and consequently a reduced system clock rate. To provide for a memory solution that bridges the performance gap between DRAM and HDD, a memory subsystem is required that overcomes the speed limitations of a conventional system having a shared memory bus and stubs.

BRIEF SUMMARY

In one aspect, the invention features a memory module with a plurality of memory-containing devices (MCDs). Each MCD has an input port, an output port, a memory, and a bridge in communication with the input port, the output port, and the memory. The bridge is adapted to receive a command and a data packet from the input port and adapted to execute in response to the command at least one of a transfer of a portion of the data packet from the input port to the memory, a transfer of a portion of the data packet from the input port to the output port, and a transfer of a portion of a memory packet from the memory to the output port. A circuit board has the MCDs mounted thereto and has a plurality of conducting paths for serial communication between at least two of the MCDs.

In another aspect, the invention features a configurable memory subsystem with a memory module having a first MCD pair and a second MCD pair mounted thereto. Each of the MCD pairs has a first MCD and a second MCD. Each MCD has an input port, an output port, a memory, and a bridge in communication with the input port, the output port, and the memory. The bridge is adapted to receive a command and a data packet from the input port and adapted to execute in response to the command at least one of a transfer of a portion of the data packet from the input port to the memory, a transfer of a portion of the data packet from the input port to the output port, and a transfer of a portion of a memory packet from the memory to the output port. Each of the MCD pairs has a pair input in communication with the input port of the first MCD and in communication with a plurality of input conductors on an edge of the circuit board. The output port of the first MCD is in communication with the input port of the second MCD. The output port of the second MCD is in communication with a pair output and in communication with a plurality of output conductors on the edge of the circuit board. A loop-back device is in communication with the memory module. The loop-back device receives the command and the data packet from the pair output of the first MCD pair and transmits the command and the data packet to the pair input of the second MCD pair.

In another aspect, the invention features a configurable memory subsystem with a forward memory module and a reversed memory module. Each of the forward and reversed memory modules has a circuit board divided into an upper half and a lower half. Each of the upper and lower halves includes a plurality of MCD pairs mounted thereto. Each of the MCD pairs has a pair input for receiving packets and a pair output for transmitting packets. The upper half has an outer MCD pair and an inner MCD pair. Each MCD pair is disposed adjacent to a same unpopulated MCD pair mounting location. The lower half has an outer MCD pair and an inner MCD pair. The outer MCD pair is disposed adjacent to the inner MCD pair. The inner MCD pair is disposed adjacent to an unpopulated MCD pair mounting location adjacent to the upper half. The reversed memory module is disposed adjacent to the forward memory module, wherein a linear order of MCD pairs on the reversed memory module is opposite to a linear order of the forward memory module. The at least one of the MCD pairs on the upper half of the forward memory module being in serial communication with at least one of the MCD pairs on the lower half of the reversed memory module. The at least one of the MCD pairs on the lower half of the forward memory module being in serial communication with the at least one of the MCD pairs on the upper half of the reversed memory module.

BRIEF DESCRIPTION OF THE SEVERAL VIEWS OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 5B is a schematic view of the loop-back signals of one channel of the memory module in FIG. 5A for an eight-bit bus.

DETAILED DESCRIPTION

Embodiments of configurable modules and memory subsystems described herein provide a user the flexibility to configure the number of memory channels, memory speed and memory capacity or any combination thereof. The user includes, but is not limited to, the product consumer or any person or entity involved with manufacturing the product. In one example, a personal computer includes a motherboard with four memory modules attached by electrical sockets. The user configures the system by removing memory modules and replacing them in other sockets or replacing them with different memory modules having different attributes. The user reverses the orientation of the memory module to alter the connections between the memory module and the motherboard. Alternatively, the user reprograms a controller that communicates with the memory modules.

The controller provides communication between the host system and the memory modules, the latter configured in one or more daisy-chained rings. As used herein, communication refers generally to electrical voltage conduction over a circuit board trace, although other communication techniques such as current conduction, fiber-optic conduction, or inductive coupling are contemplated in other embodiments. Upon powering up the host system, the controller sends command packets to the interconnected memory modules to learn the characteristics of the memory modules. The controller then sends and receives commands and optionally data packets to the rings. The rings originate and terminate at the controller and the controller can configure the number of rings.

The various configurable memory subsystems described herein are, for example, systems ranging from high-capacity storage class memories, high-speed personal computer memories or low-power memories for portable devices. The memory subsystems can replace HDDs with a solid-state drive (SSD) thereby reducing both power consumption and data access latency, and improving life-time and shock resistance. Using a combination of various memory types, speed and capacities of the memory subsystems described herein enables new memory applications.

Figure 1:
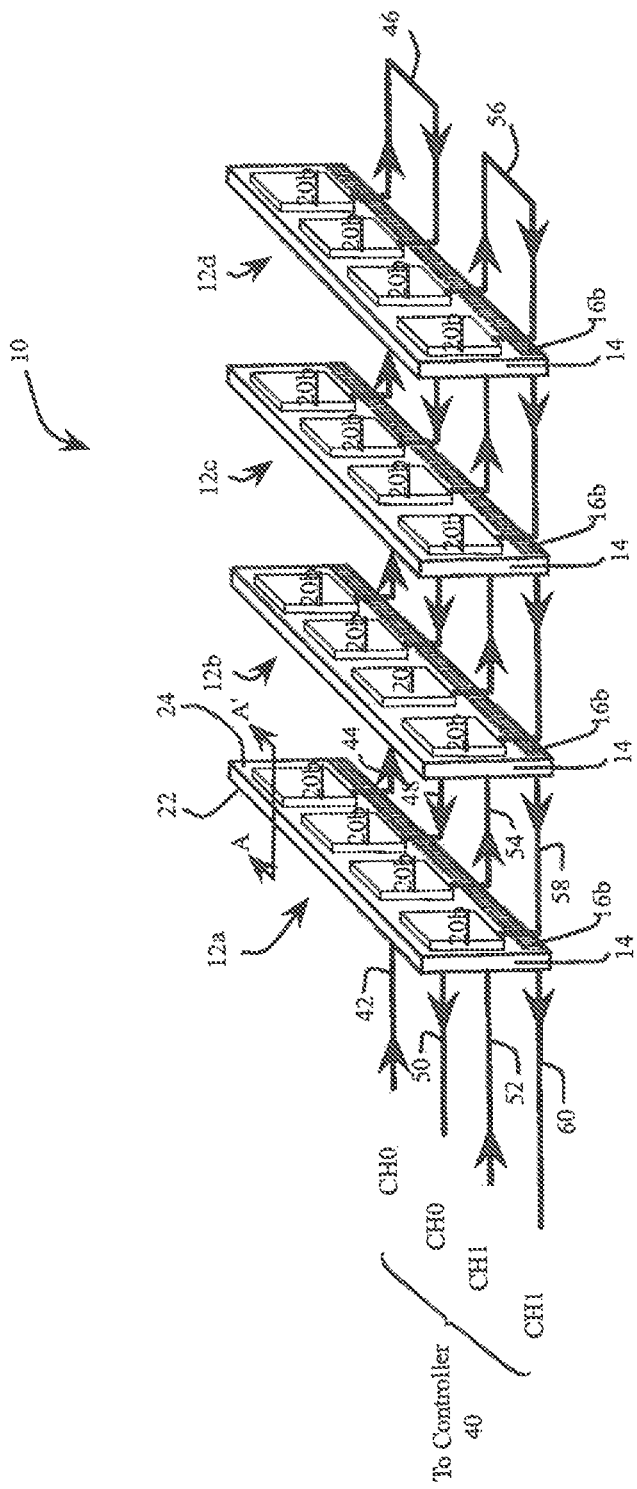
FIG. 1 is a perspective view of an embodiment of a configurable memory subsystem according to the invention.

FIG. 1 shows a perspective view of an embodiment of a memory subsystem 10 with four memory modules 12a, 12b, 12c and 12d (generally 12) and illustrates the direction of flow of command and data packets for two channels. The memory subsystem 10 can contain any number of memory modules 12. Each memory module 12 has a circuit board 14 with conductors 16a on a front-side 22 and conductors 16b (generally 16) on a back-side 24 for communication with another circuit board 14 such as a motherboard. The conductors 16 can communicate with another circuit board 14 through a socket connection, a soldered connection to the other board, or through a variety of means as are known by those in the art. The circuit board 14 has a plurality of MCDs 20a attached to a front side 22 and MCDs 20b attached to a back-side 24. The front-side 22 of the circuit board 14, including MCDs 20a and conductors 16a, is not visible in FIG. 1 because of the viewing angle afforded by the perspective view, but can be seen in FIG. 3. MCDs 20a and MCDs 20b (generally 20) are either similarly constructed or have different pin order or different types, quantities and capacities of components included therein. Examples of MCD 20 include a multi-chip device and a monolithic device (having one component).

The memory modules 12 interact with a controller 40 that coordinates the data communication between the memory modules 12 and the host system. FIG. 1 depicts a two-channel system. The first channel (CH0) receives a command and optionally a data packet on bus 42 from the controller 40. The packet on bus 42 flows through the first memory module 12a and exits as a packet on bus 44. Similarly, the packet on bus 44 flows through memory modules 12b, 12c and 12d in succession, returns to 12d through a loop-back path 46, and flows through memory modules 12d, 12c and 12b in succession resulting in a packet on bus 48. The packet on bus 48 flows through memory module 12a, exits as a packet on bus 50 and returns to the controller 40 thereby completing a daisy-chained ring. The second channel (CH1) follows a similar path to the first channel CH0, beginning as a packet on bus 52, flowing through memory module 12a, exiting as a packet on bus 54 and flowing though memory modules 12b, 12c and 12d in succession. The channel CH1 then returns to 12d through a loop-back path 56. Subsequently, the channel CH1 proceeds through memory modules 12d, 12c and 12b in succession, entering memory module 12a as a packet on bus 58 and exiting as a packet on bus 60 and communicating with the controller 40.

The controller 40 configures the width of the command and data packets. Various embodiments illustrated throughout the figures show an eight-bit wide bus. Although one bit, four bit and eight bit widths are typically used, any width is within the scope of the invention. A narrow bus width reduces the physical size of the system, however a wider bus width increases the system bandwidth or rate at which data flows through the system.

The representative memory module 12 includes conductors 16 on the edge of the circuit board 14. In one embodiment the form factor and physical shape of the memory module 12 conforms to a DDR2 SDRAM 200-pin small outline dual in-line memory module (SO-DIMM) standard. In another embodiment the memory module 12 conforms to a 240-pin DDR2 SDRAM SO-DIMM form factor. These form factors are cost effective owing to their popularity in the industry. Although the aforementioned standards were developed for synchronous dynamic random access memory (SDRAM), they are equally applicable to other forms of memory including non-volatile memory (NVM).

Figure 2:
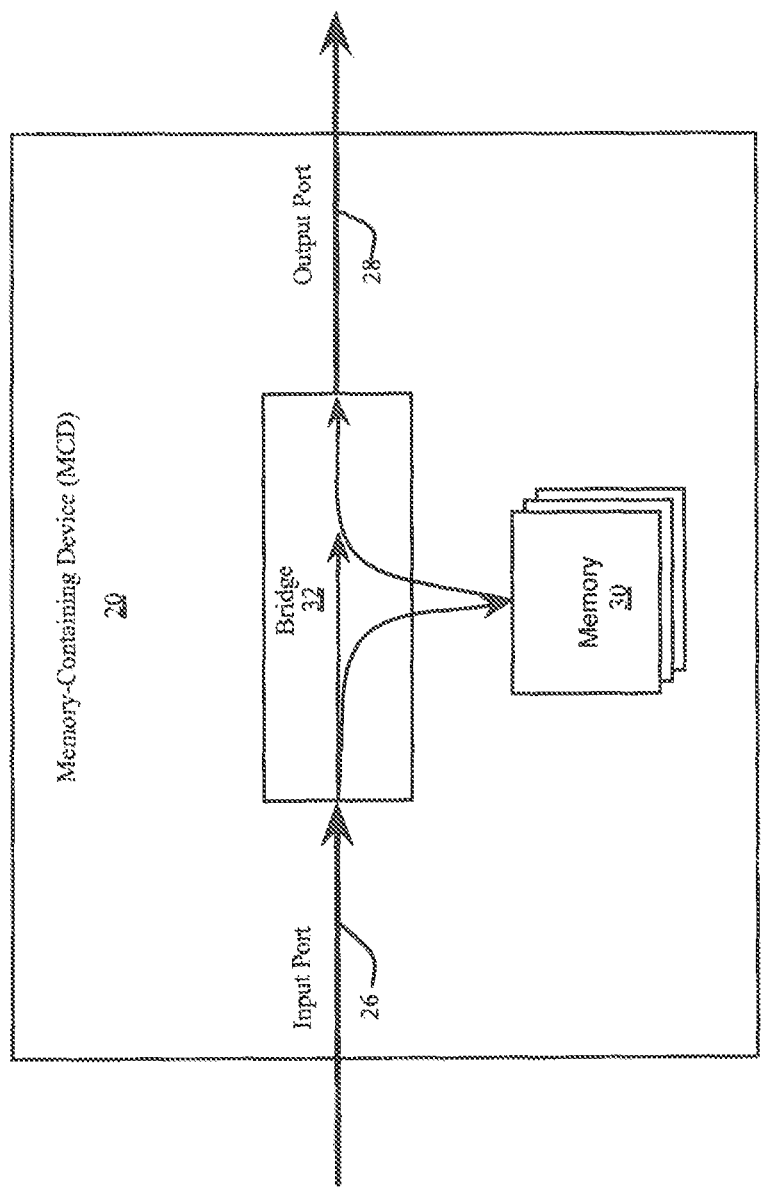
FIG. 2 is a schematic view of an MCD.

FIG. 2 illustrates the general function of the MCD 20. A bridge 32 receives a command and optionally a data packet at the input port 26. The command packet instructs the bridge 32 to perform one or more operations that include writing a portion of the data packet into the memory 30, transferring a portion of the data packet to the output port 28 or transferring a portion of a memory packet from the memory 30 to the output port 28. In a ring topology, as described in FIG. 1 where the MCDs 20 are connected in series, the bridge 32 allows the command and data packets to propagate through all of the devices on the ring. Each ring corresponds to a channel, for example CH0 and CH1 as illustrated in FIG. 1. The bridge 32 permits data to be written to any MCD 20 or broadcast to all the MCDs. Similarly data can be written to one MCD 20 in the channel while simultaneously reading data from another MCD 20 further down-stream, which is at a location that is closer to where the channel returns to the controller 40.

Upon power up, the controller 40 assigns a unique number to each MCD 20 on each channel. The controller 40 also interrogates each MCD 20 to determine the characteristics of the memory 30. For example, different MCDs 20 can have different amounts of memory capacity, a variety of memory speeds and memory types. In one embodiment each of the MCDs 20 has eight stacked NAND Flash NVMs with each memory supporting eight bit data transfers to and from the memory 30. Other embodiments use such non-volatile memory types as NOR Flash, EEPROM, ferroelectric RAM (FRAM), magneto-resistive RAM (MRAM), phase change RAM, MEMS RAM, ROMs and others known to those in the art. In another embodiment, one or more of the MCDs 20 include volatile memories such as SRAM, and DRAM. In another embodiment, each MCD 20 includes a mixture of volatile and non-volatile memories, a mixture of memories of different capacity and a mixture of memories of different speeds. Memory speed typically refers to sustained data throughput determined by a clock rate, although memory speed can also refer to latency. In various embodiments, the memory 30 is manufactured from a combination of CMOS, MOS and bipolar designs whether based on silicon, carbon, gallium arsenide (GaAs) and other semiconductor technologies, known to those in the art.

Assembly of the MCD 20 is based on either a monolithic device or a multi-chip device. A multi-chip device can be based on technologies that employ stacked components, components placed on a common substrate ("side-by-side"), system in package (SiP), package in package (PiP) and package on package (PoP) technologies. A component can be a CMOS design in a semiconductor technology for example.

In one embodiment the bridge 32 is a fabricated semiconductor chip or die as disclosed in commonly owned U.S. patent application Ser. No. 12/401,963 filed on Mar. 11, 2009 entitled "A COMPOSITE MEMORY HAVING A BRIDGING DEVICE FOR CONNECTING DISCRETE MEMORY DEVICES TO A SYSTEM", which is hereby incorporated by reference, wherein the bridge 32 uses a HYPERLINK® NAND (HLNAND™) Flash interface.

The HYPERLINK® topology includes an HL2 version that uses a source synchronous clock and an HL1 version that uses a parallel clock. The HL2 version is preferable over the HL1 version to optimize the benefits of reduce signal loading however both versions are envisioned within the scope of this invention.

Figure 3:
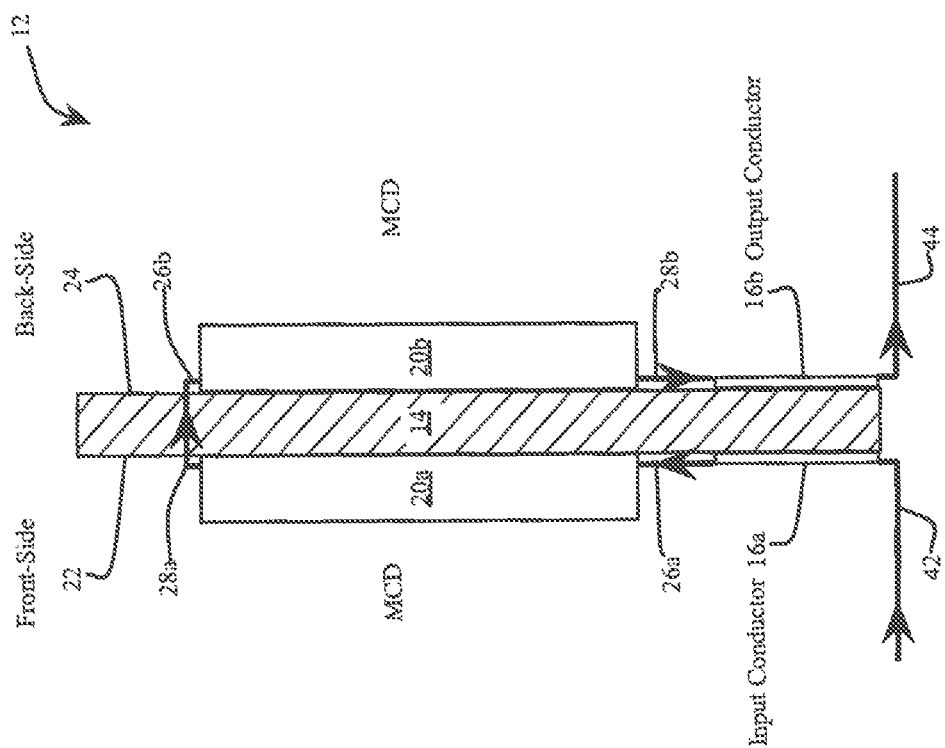
FIG. 3 is a cross-sectional view of FIG. 1 taken along A-A', further illustrating the direction of one of the communication channels.

FIG. 3 shows a first MCD 20a on a front-side 22 of a circuit board 14 and a second MCD 20b on a back-side 24 of the circuit board 14. The MCDs 20 are in serial communication with each other and form an MCD pair. The output port 28a of MCD 20a is positioned proximate to the input port 26b of the second MCD 20b to reduce the communication path and hence the capacitive loading. Proximately located means that the lengths of all of the bit paths within a port are averaged together, rather than optimizing the length of one bit more than another bit.

FIG. 3 further illustrates the direction of channel communication from FIG. 1. A packet on bus 42 from CH0 communicates with the memory module 12 through the input conductors 16a. In one embodiment, the input conductors 16a and the output conductors 16b make contact with a socket that is attached to a motherboard, wherein the socket has electrical connections with the controller 40. In another embodiment, the socket attaches to a daughter board, which in turn attaches to the motherboard. A daughterboard arrangement gives the user further control over configuring how the memory modules 12 communicate with each other. In another embodiment, the input conductors 16a and output conductors 16b attach to either a daughter board or a mother-board by a soldered connection. In other embodiments, either or both of the input conductors 16a and the output conductors 16b are disposed on one or both sides of the circuit board 14. The input port 26a of the first MCD 20a receives the packet on bus 42, and the output port 28a of the first MCD 20a transmits at least the command portion of the packet on bus 42 through conductors in the circuit board 14 to the input port 26b of the second MCD 20b. The second MCD 20b subsequently transmits from the output port 28b and through output conductors 16b at least the command portion of the packet received at the input port 26b of MCD 20b.

Figure 4:
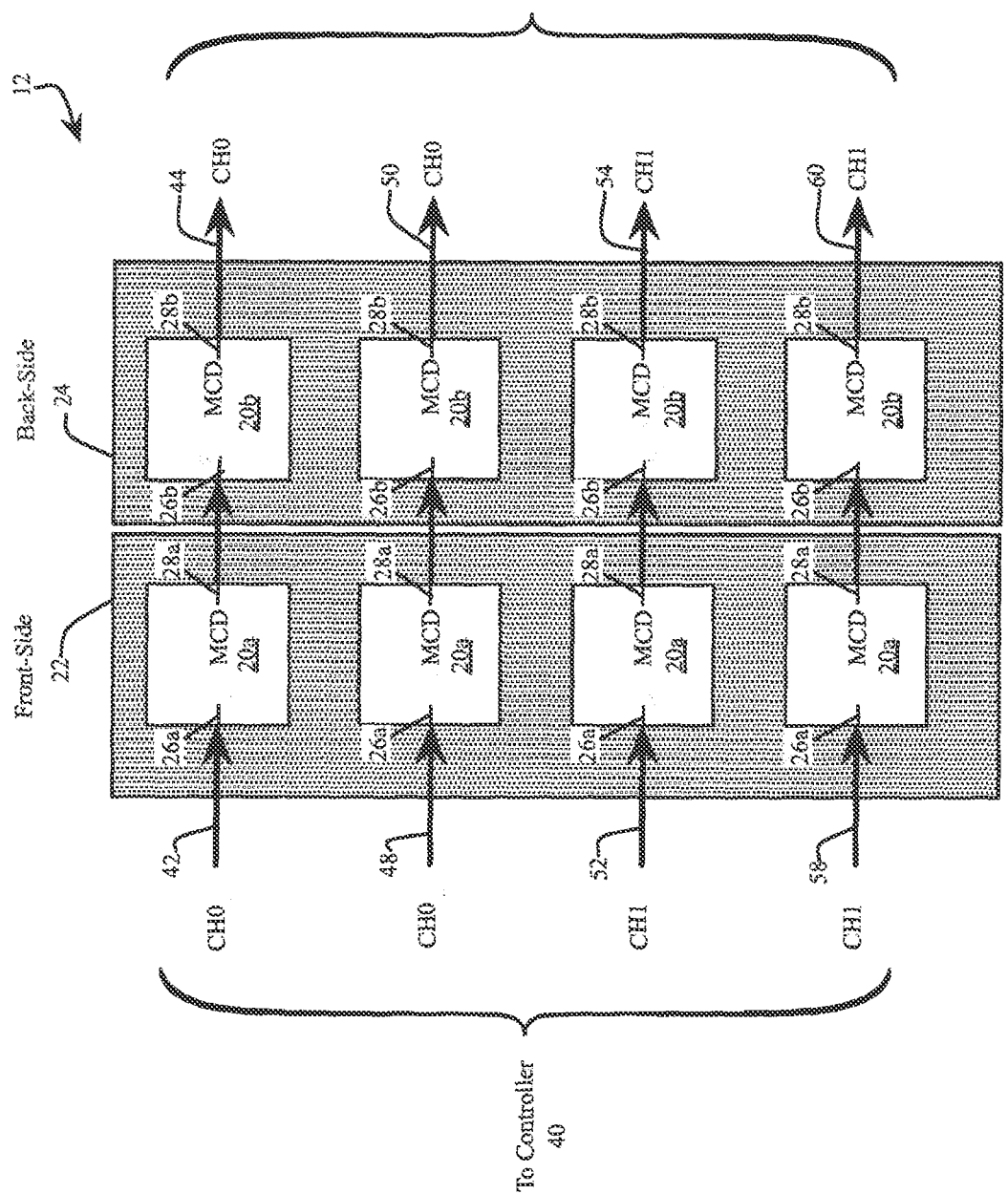
FIG. 4 is schematic view of the front-side and back-side of a memory module showing communication between four MCD pairs.

FIG. 4 shows the front-side 22 and the back-side 24 of the memory module 12. In this embodiment the channel directions conform to the directions shown in FIG. 1. For CH0, the packet on bus 42 communicates with the input port 26a of the first MCD 20a mounted on the front-side 22 of module 12. MCD 20a transmits from the output port 28a to the input port 26b of MCD 20b on the back-side 24 of the module 12. MCD 20b on the back-side 24 of the module 12 transmits a packet on bus 44 to the next module. After propagating through a plurality of other modules and returning to the module 12, the input port 26a of MCD 20a on the front-side 22 of the module 12 receives a packet on bus 48. MCD 20a at output port 28a transmits to the input port 26b of MCD 20b on the back-side of the module 12. MCD 20b on the back-side 24 of the module 12 then transmits a packet on bus 50 to the controller 40. A similar path for CH1 is shown in FIG. 4.

Figure 5A:
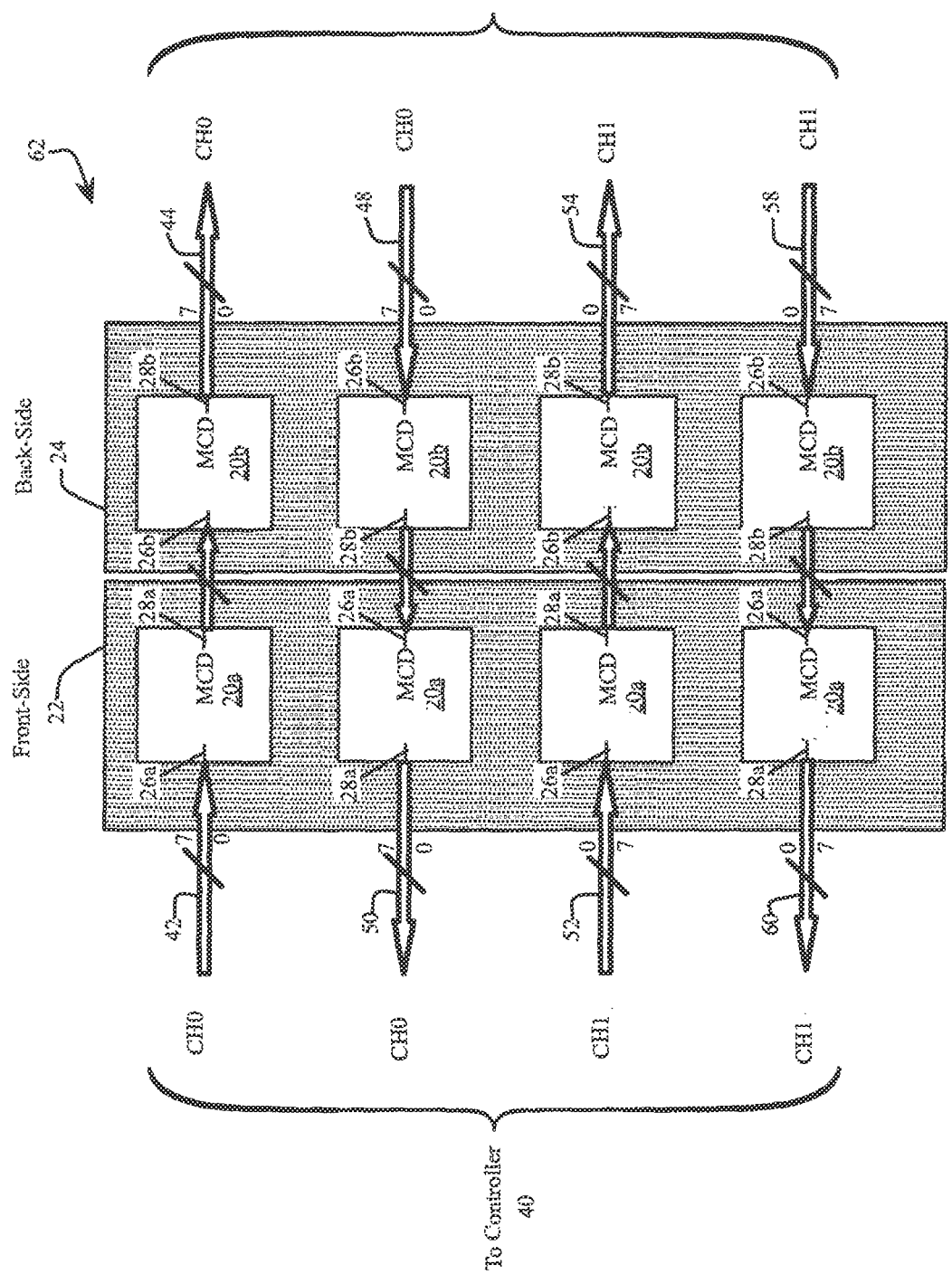
FIG. 5A is a schematic view of the front-side and back-side of a memory module showing alternating placement of MCD pairs.

FIG. 5A is an alternative embodiment to that shown in FIG. 4 wherein the communication paths between the conductors 16, and the MCDs 20 shown in FIG. 3 are modified so that a packet on bus 48 communicates with the input port 26b of the MCD 20b on the back-side 24 of the memory module 62, the output port 28b of the MCD 20b on the back-side 24 of the memory module 62 communicates with the input port 26a of the MCD 20a on the front-side 22 of the memory module 62 and the output port 28a of the MCD 20a on the front-side 22 of the memory module 62 transmits a packet on bus 50 to the controller 40. A similar path for CH1 is shown in FIG. 5A.

FIG. 5B illustrates the loop-back connection 46 of FIG. 1 further illustrated in subsequent figures. More particularly, FIG. 5B illustrates a bus order of the output port 28b of the MCD 20b, transmitting a packet on bus 44 for CH0, and mounted on the back-side 24 of the memory module 62 and the bus order of the input port 26b of the MCD 20b receiving a packet on bus 48 for CH0, and mounted on the back-side 24 of the memory module 62. In this embodiment, the output port 28b transmitting a packet on bus 44 and the input port 26b receiving a packet on bus 48 are each configured to have eight bits shown as 70, 71, 72, 73, 74, 75, 76 and 77, where the bit 70 corresponds to the least significant bit (LSB) and the bit 77 corresponds to the most significant bit (MSB). The bus order shown in FIG. 5B requires signals to cross over each other, however it has the advantage that each bit 70-77 has a similar length and therefore a similar capacitive loading on the driver of the output port 28b. Similarly the loop-back connection 56 of FIG. 1 as implemented by the output port 28b transmitting a packet on bus 54 and the input port 26b receiving the packet on bus 58 has a bus order with signals that cross over each other; however each bit of the bus 56 has a similar length and therefore a similar capacitive loading on the driver of the output port 28b. A similar loading on all of the bits is advantageous because the driver is designed to drive the bit with the highest capacitive loading, which requires a larger peak current consumption and driver area on MCD 20b. Furthermore, a memory device typically has limited drive capability when the process used to fabricate the memory is optimized for memory density rather than high transmission speed.

Figure 6A:
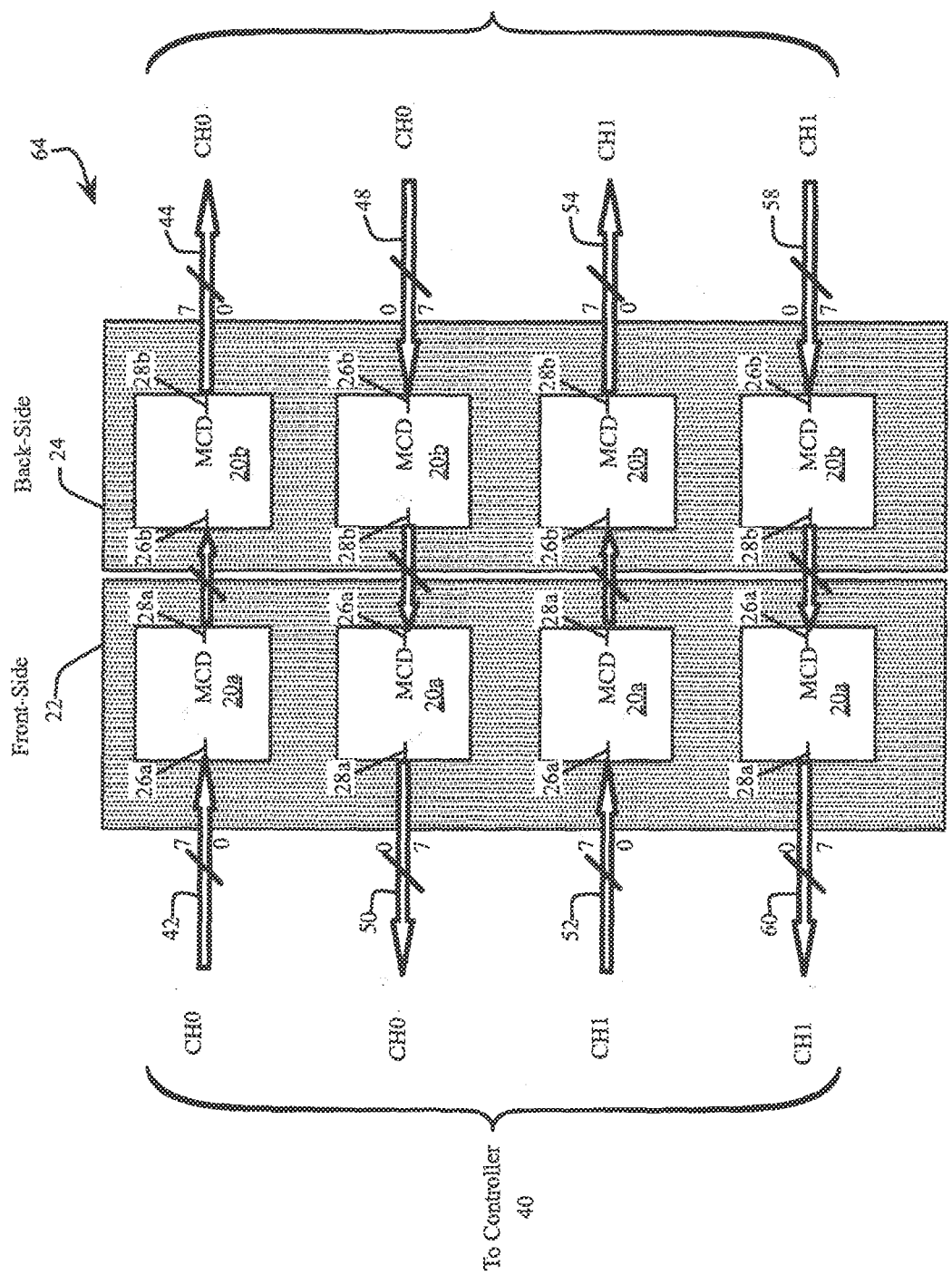
FIG. 6A is a schematic view of the front-side and back-side of a memory module showing alternating placement of MCD pairs, and alternating bus order of two of the MCD pairs.
Figure 6B:
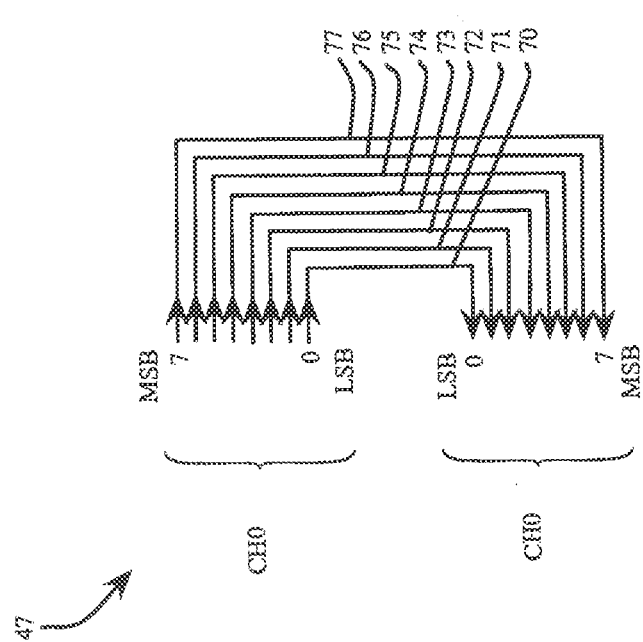
FIG. 6B is a schematic view of the loop-back signals of one channel of the memory module in FIG. 6A for an eight-bit bus.

FIG. 6A is an alternative embodiment to that shown in FIG. 5A wherein the bus order of the input port 26b receiving a packet on bus 48 is reversed from the bus order of the output port 28b transmitting a packet on bus 44, and the bus order of the input port 26b receiving a packet on bus 58 is reversed from the bus order of the output port 28b transmitting a packet on bus 54. In contrast to the embodiment shown in FIG. 5A and FIG. 5B, the embodiment of FIG. 6A reduces routing complexity by eliminating cross-over of any of the bits 70-77; however one bit 70 has the shortest length and another bit 77 has the longest length. The increased bit length of the longest bit 77 illustrated in FIG. 6B (compared to FIG. 5B) requires a larger driver for the output 28b, however the loop-back paths 46 and 56 do not require additional circuit board layers as a result of bits crossing other bits. In one embodiment, either the bus order as illustrated in FIGS. 5A and 5B or the bus order as illustrated in FIGS. 6A and 6B modifies the embodiment shown in FIG. 4.

Figure 7:
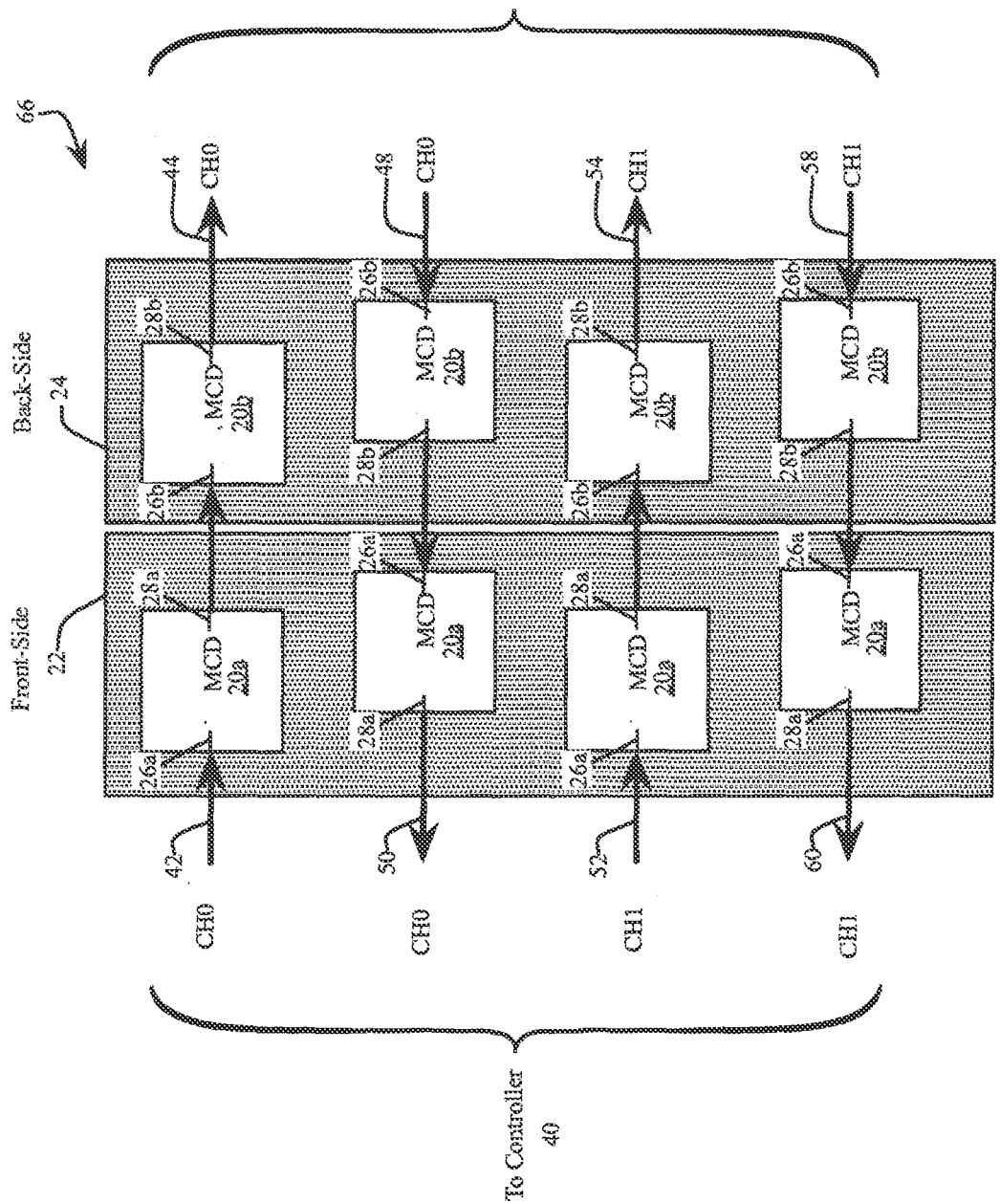
FIG. 7 is a schematic view of the front-side and back-side of a memory module showing alternating and staggered placement of MCD pairs.

FIG. 7 shows an embodiment wherein the MCDs 20a on the front-side 22 of the memory module 66 are not collinear to the other MCDs 20a, and the MCDs 20b on the back-side 24 of the memory module 66 are not collinear to the other MCDs 20b. The MCDs 20a and MCDs 20b are mounted to the memory module 66 in a staggered arrangement. This embodiment advantageously permits the mounting of an additional component (not shown) in proximity with the output port 28a of the MCD 20a or the output port 28b of the MCD 20b, for example a series resistor or a capacitor to filter a signal transient response.

Figure 8:
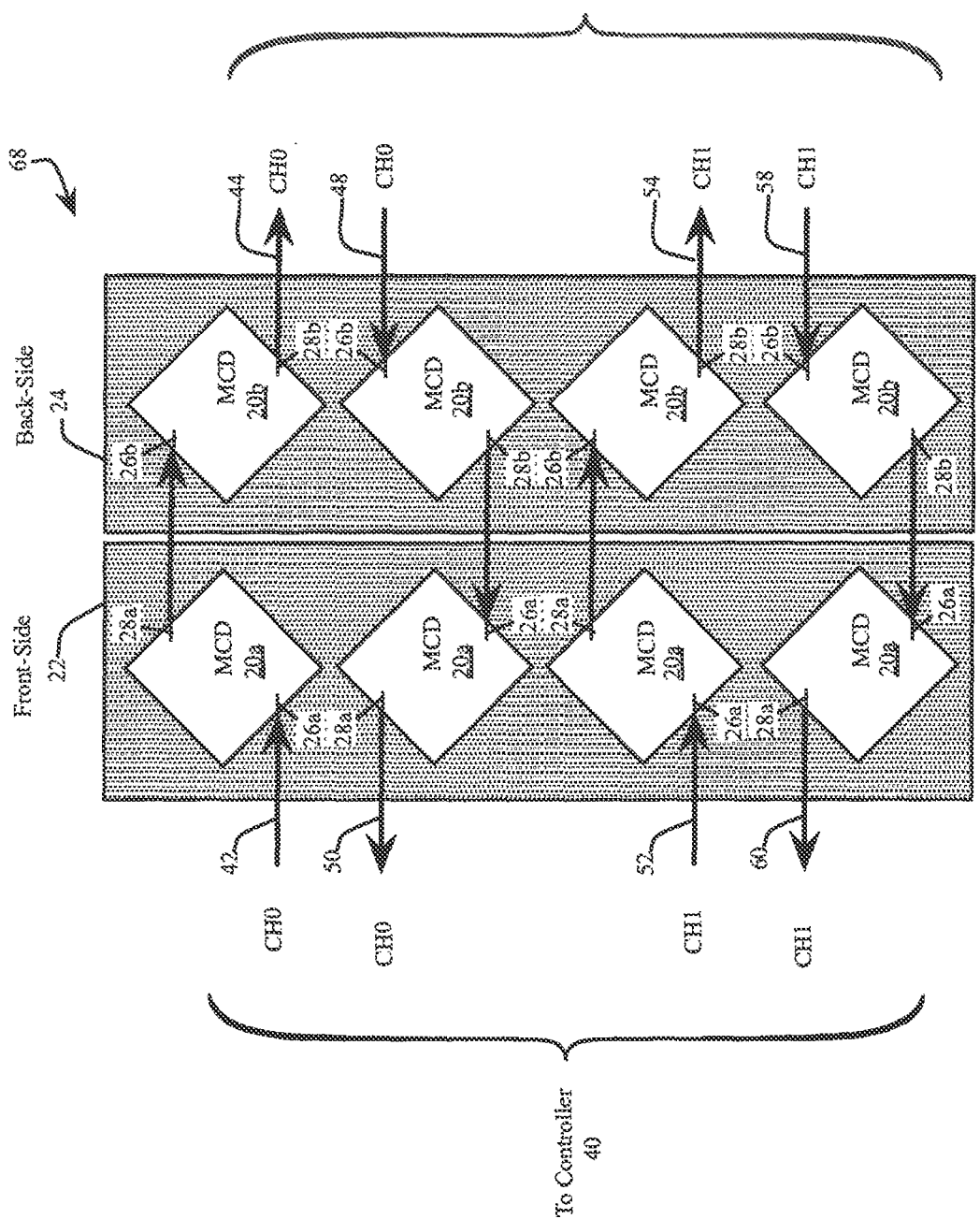
FIG. 8 is a schematic view of the front-side and back-side of a memory module showing alternating and rotated placement of MCD pairs.

FIG. 8 shows an embodiment with the MCDs 20a and the MCDs 20b rotated on a memory module 68. This MCD rotation advantageously facilitates signal routing between the output port 28a of MCD 20a and the input port 26b of MCD 20b, and signal routing between the output port 28b of MCD 20b and the input port 26a of MCD 20a. The rotation provides the advantage of reducing the length of loop-back paths 46 and 56 shown in FIG. 1.

Figure 9:
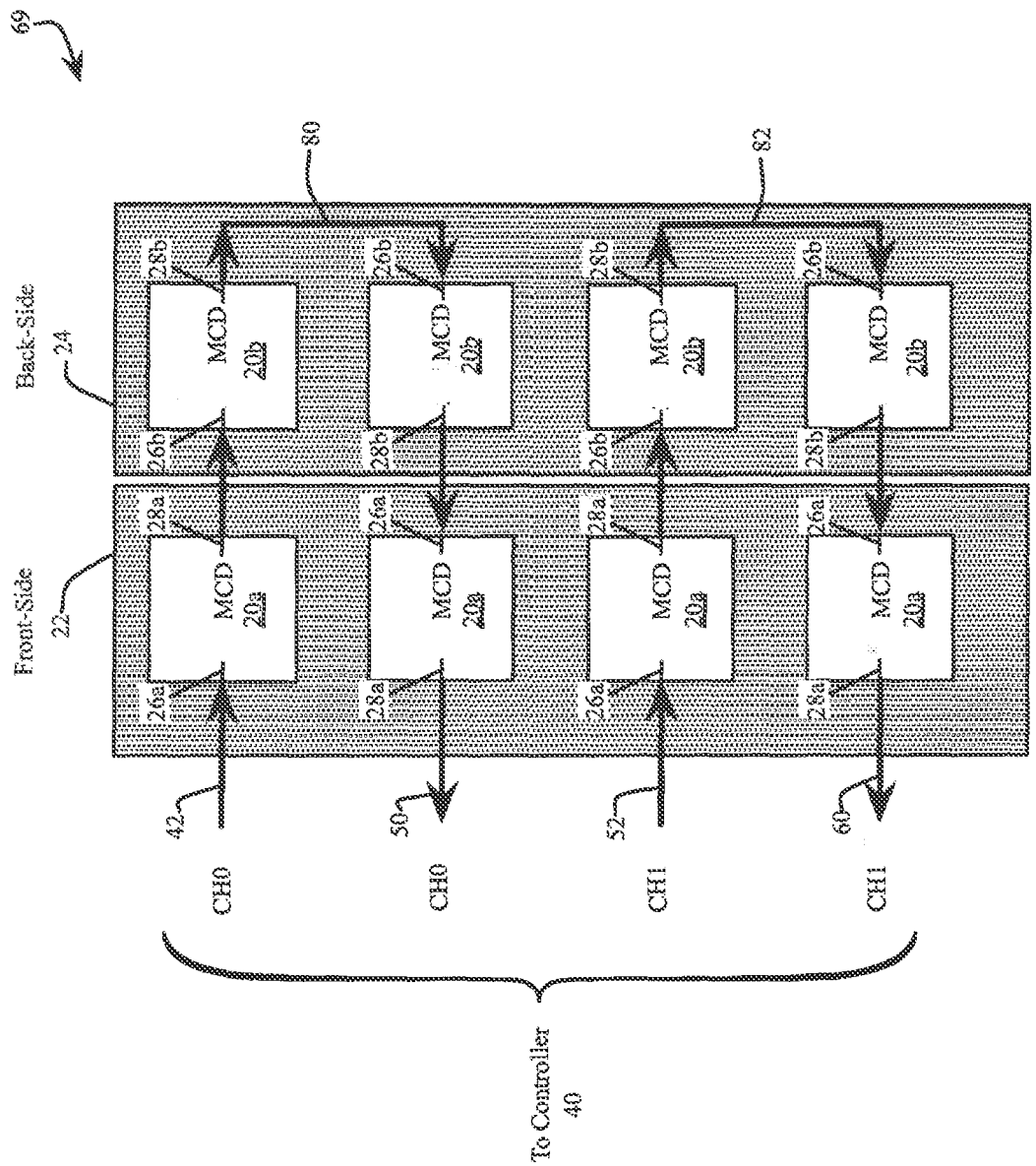
FIG. 9 is a schematic view of an embodiment of a loop-back device including four MCD pairs.

FIG. 9 shows a modification of the memory module 64 of FIG. 6A that is equally applicable to any of the aforementioned embodiments. The illustrated memory module 69 combines the loop-back paths 46 and 56 shown in FIG. 1. Specifically, the output port 28b of the MCD 20b mounted on the back-side 24 communicates with the input port 26b of the MCD 20b mounted on the back-side 24 through path 80. In addition, the output port 28b of the MCD 20b mounted on the back-side 24 communicates with the input port 26b of the MCD 20b mounted on the back-side 24 through path 82. With reference to FIG. 1 showing an embodiment of a configurable memory subsystem 10 with four memory modules 12, a user reduces the capacity of the subsystem 10, in one embodiment, by removing module 12d and inserting a termination module that has conduction paths to complete the ring connections through loop-back path 46 and through loop-back path 56. In an alternative embodiment, where memory module 69 replaces memory module 12d shown in FIG. 1, the user incrementally reduces memory subsystem 10 capacity by swapping the position of memory module 69 with either memory module 12c, 12b or 12a.

Figure 10:
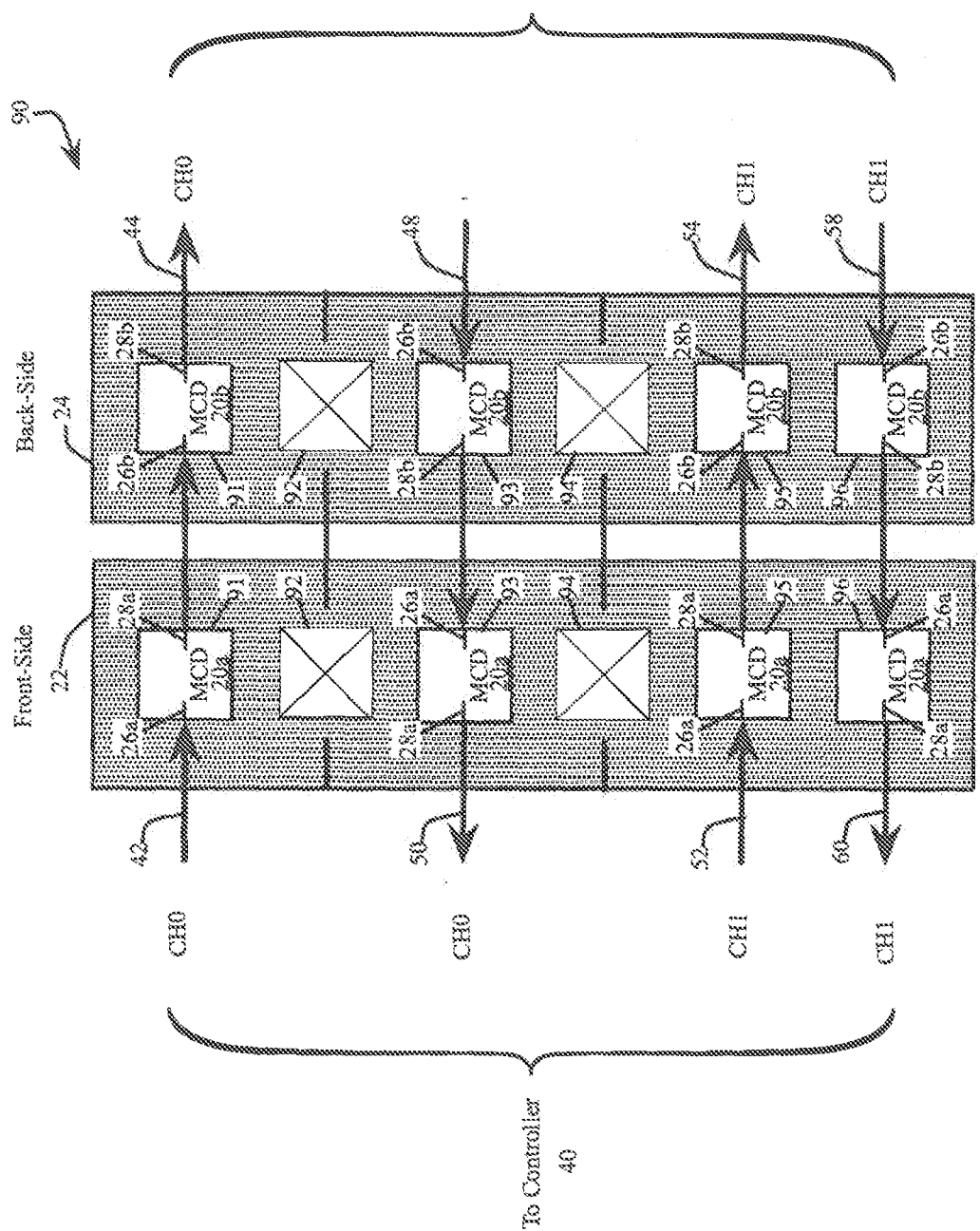
FIG. 10 is a schematic view of the front-side and back-side of a reversible memory module showing MCD mounting locations.

FIG. 10 shows a front-side 22 and a back-side 24 of a reversible memory module 90. Six locations 91, 92, 93, 94, 95 and 96 provide mounting sites for an MCD pair, with each MCD pair including an MCD 20a mounted on the front-side 22 of the memory module 90 and an MCD pair 20b mounted on the back-side of the memory module 90. The MCD pair mounting locations 91, 92 and 93 defines an upper half of the memory module 90, and the MCD pair mounting locations 94, 95 and 96 defines a lower half of the memory module 90. The upper half of the memory module 90 has an outer MCD pair mounted at MCD pair mounting location 91 and being adjacent to a same unpopulated MCD pair mounting location 92. The upper half of the memory module 90 also has an inner MCD pair mounted at MCD pair mounting location 93 and being adjacent to the same unpopulated MCD pair mounting location 92. The lower half of the memory module 90 has an outer MCD pair mounted at MCD pair mounting location 96, adjacent to an inner MCD pair mounted at MCD pair mounting location 95. The inner MCD pair is adjacent to an unpopulated MCD pair mounting location 94. The mounting locations of the MCD pairs on the memory module 90 facilitates memory system loop-back connections when the memory module 90 is placed adjacent to a reversed memory module 90b hereinafter described in further detail in FIG. 14. This embodiment is preferably made with a form factor and physical shape conforming to the 240-pin DDR2 SDRAM SO-DIMM standard, although other various form factors and shapes are contemplated. The 240-pin DDR2 SDRAM SO-DIMM standard is a cost effective industry standard format.

Another embodiment alters the embodiment shown in FIG. 10 by replicating the group of MCD pair mounting locations 91-93 and MCD pairs mounted thereto on the upper half of memory module 90 by the same number of times that the group of MCD pair mounting locations 94-96 and MCD pairs mounted thereto on the lower half of the module 90 are replicated.

Figure 11A:
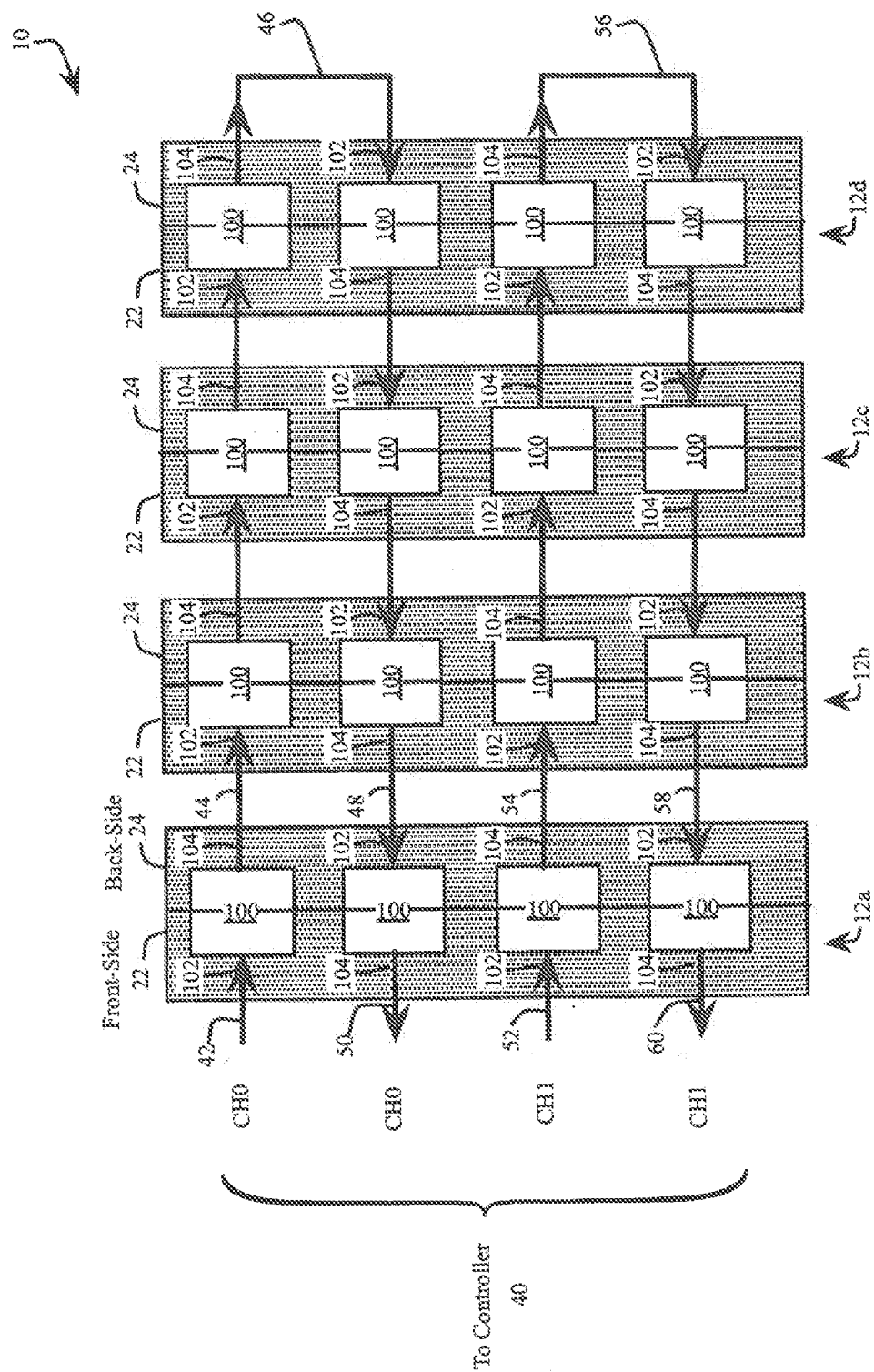
FIGS. 11A, 11B and 11C illustrate an embodiment of a two-channel memory subsystem with one of three loop-back devices.

FIG. 11A shows the two-channel configurable memory subsystem 10 configured as shown in FIG. 1. For clarity, an MCD pair 100 in FIG. 11A represents the first MCD 20*a* in communication with the second MCD 20*b* as shown in FIG. 4. Pair input 102 in FIG. 11A represents the input port 26*a* of the first MCD 20*a* on the front-side 22 of memory module 12 shown in FIG. 4. Pair output 104 in FIG. 11A represents the output port 28*b* of the second MCD 20*b* on the back-side 24 of the memory module 12. The loop-back paths 46 and 56 shown in the configurable memory subsystem 10 can be conduction paths on the same circuit board that provides communication paths between the memory modules 12 and the host controller 40. Any one or more of the memory modules 12 in FIG. 11A can be modified or replaced with the aforementioned embodiments of memory modules.

Figure 11B:
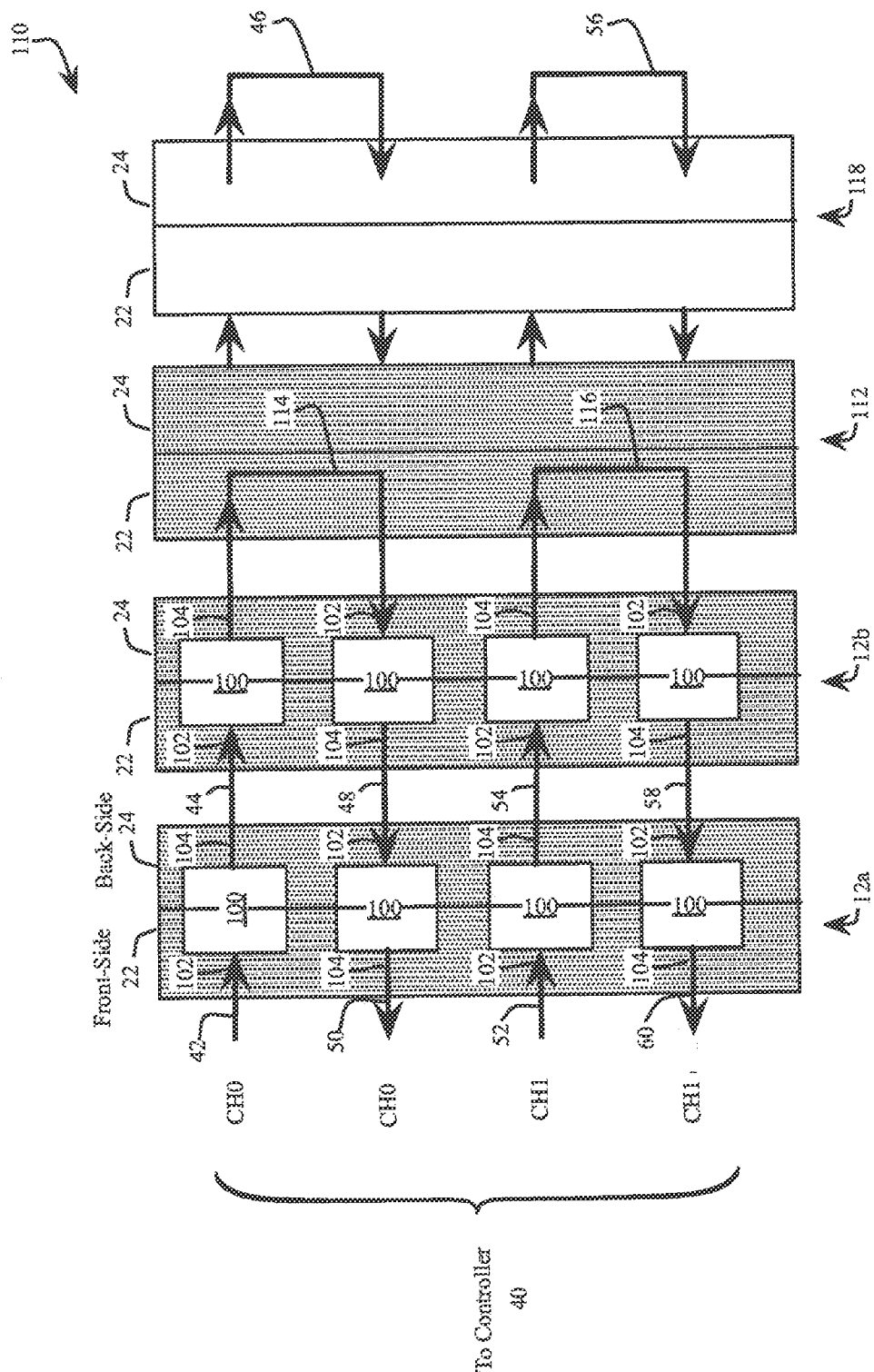

FIG. 11B shows a configurable memory subsystem 110 with the memory module 12*d* of FIG. 11A removed, resulting in an empty memory module location 118, and with the memory module 12*c* of FIG. 11A replaced by a termination module 112. The termination module 112 provides the loop-back function previously provided by the loop-back paths 46 and 56 that are disabled upon removal of the memory module 12*d*. Specifically, the pair output 104 of MCD pair 100 on memory module 12*b* communicates with the pair input 102 of MCD pair 100 on memory module 12*b* through the loop-back path 114. The pair output 104 of another MCD pair 100 on memory module 12*b* communicates with the pair input 102 of another MCD pair 100 on memory module 12*b* through the loop-back path 116.

Figure 11C:
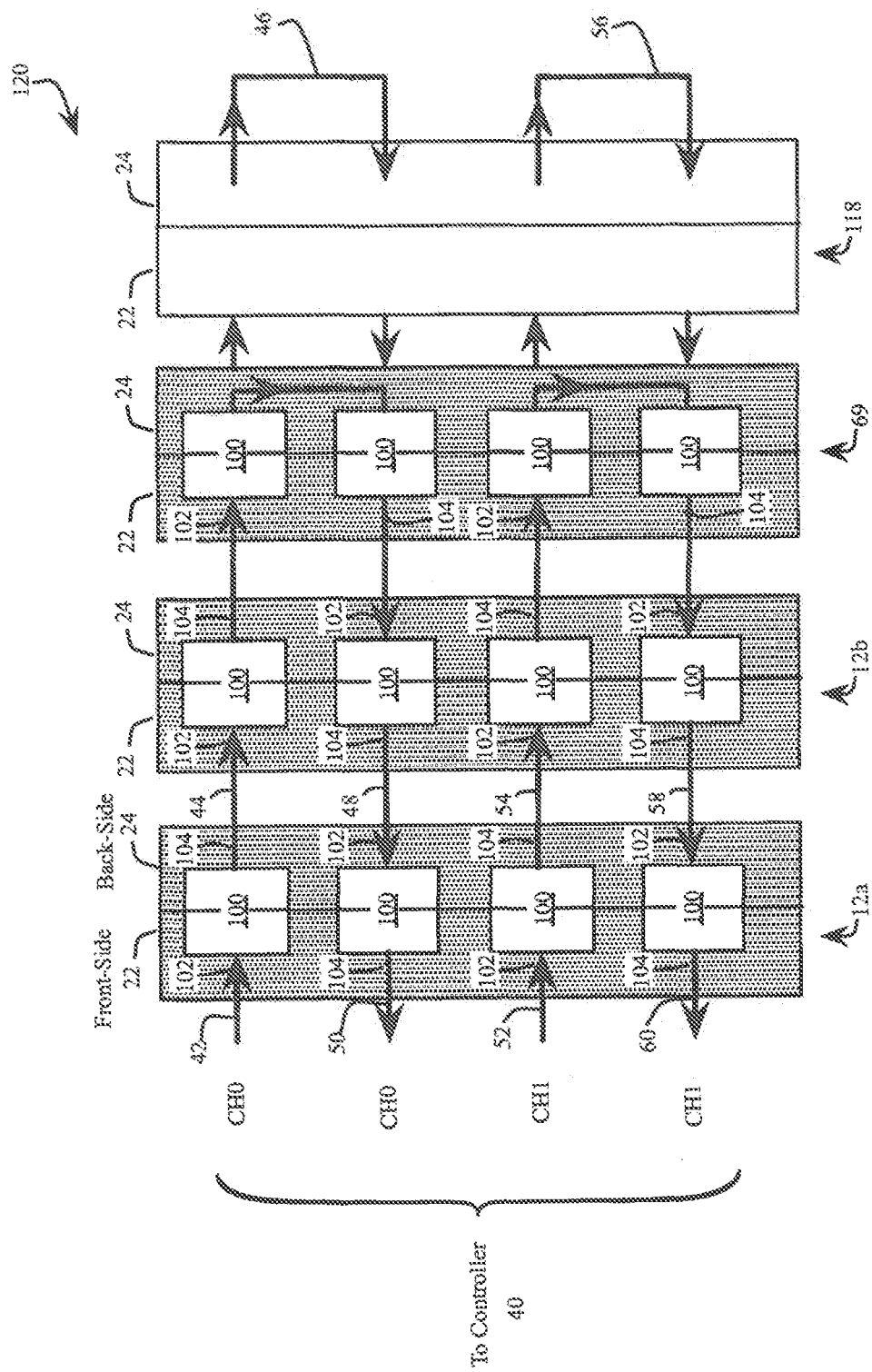

FIG. 11C shows another variation to the configurable memory subsystem of FIG. 11B with the termination module 112 replaced by the memory module 69 shown in FIG. 9 and related variants described herein. Replacing the memory module 12*b* in FIG. 11C with the memory module 69 results in the same memory capacity as the memory subsystem 110 shown in FIG. 11B.

Replacing any of the memory modules 12*a*, 12*b* or 69 with variants that have MCD pairs 100 with a different memory capacity, memory speed, or memory type further reconfigures the memory subsystem 120. For example an MCD pair 100 can contain ROM to be used to "boot" a host system or load an operating system upon application of power. The memory subsystem 120 can be configured with shorter rings for each channel so that MCD pairs 100 with memories requiring slower clock rates can be used without increasing the ring latency. Ring latency for CH0 is the elapsed time between the controller 40 transmitting a packet on bus 42 to the memory module 12*a* and the controller 40 receiving a packet on bus 50 from the memory module 12*a*. Use of memories having slower clock rates can reduce the configurable memory subsystem 120 cost because slower memories are generally available from older manufacturing technologies. In addition, a memory subsystem using slow memories can be reconfigured for use with an upgraded host system that requires shorter ring latency. The shortest ring latency can be achieved by replacing the memory module 12*a* with the memory module 69.

Figure 12A:
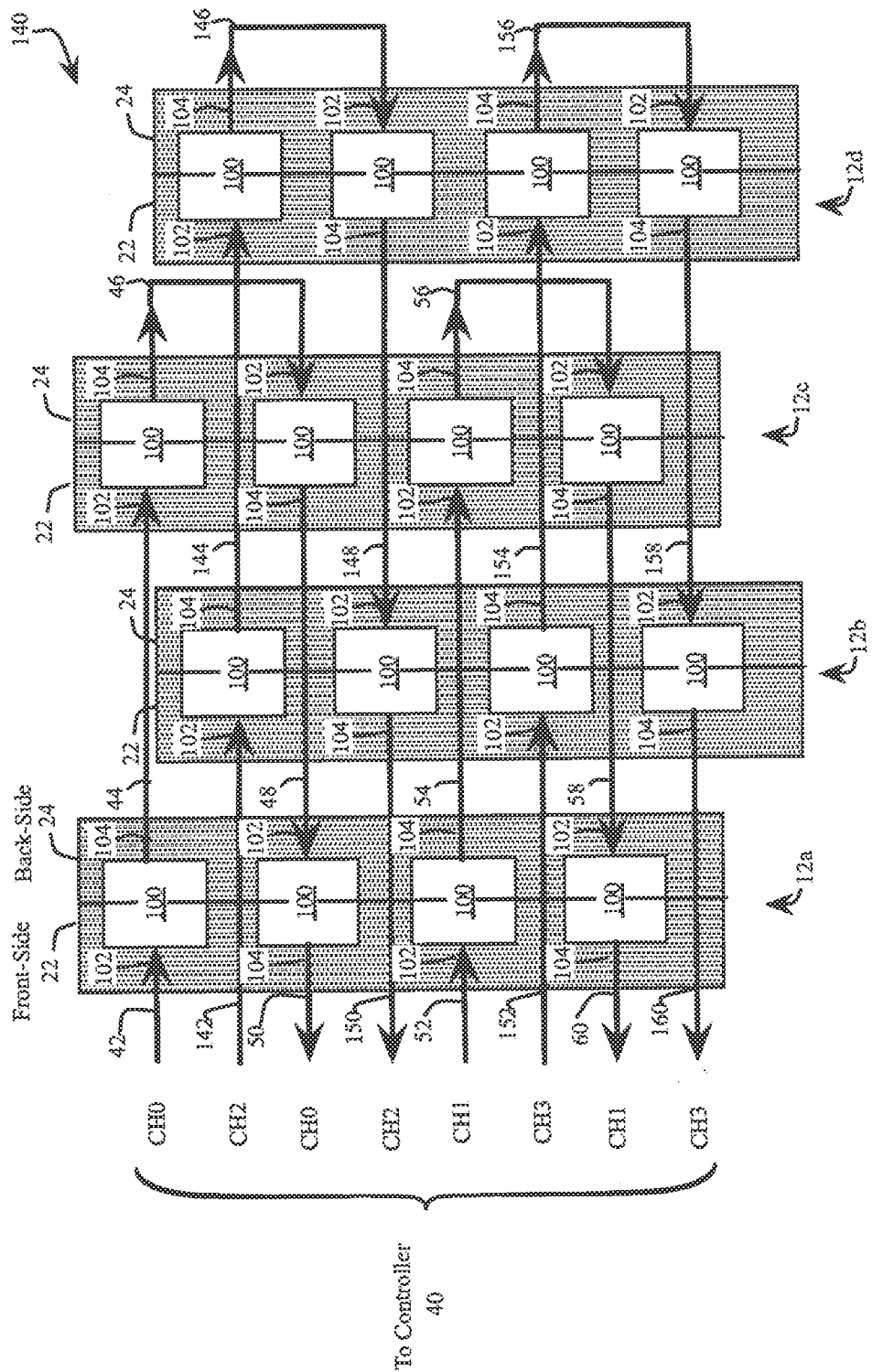
FIGS. 12A, 12B and 12C illustrate an embodiment of a four-channel interleaved memory subsystem with one of three loop-back devices.

FIG. 12A shows a four-channel interleaved memory subsystem 140. In comparison to the memory subsystem 10 in FIG. 11A, the memory subsystem 140 has twice as many channels with each channel having half the memory capacity. A user can increase the number of memory channels to take advantage of a host upgrade from a single processor system to a multi-processor system that executes several processes in parallel.

Representative channel CH0 receives a packet on bus 42 from the controller 40. An MCD pair 100 on the memory module 12*a* receives the packet on bus 42 at the pair input 102 and transmits a packet on bus 44 from the pair output 104 of the MCD pair 100 on the memory module 12*a*. An MCD pair 100 on the memory module 12*c* receives the packet on bus 44 at the pair input 102 and transmits a packet through a loop-back path 46 to the input port 102 of another MCD pair 100 on the memory module 12*c*. The other MCD pair 100 on the memory module 12*c* transmits a packet on bus 48 to the input port 102 of another MCD pair 100 on the memory module 12*a*. The other MCD pair 100 transmits a packet on bus 50 from the output port 104 to the controller 40.

Representative interleaved channel CH2 receives a packet on bus 142 from the controller 40. An MCD pair 100 on the memory module 12*b* receives the packet on bus 142 at pair input 102 and transmits a packet 144 from the pair output 104 of the MCD pair 100 on the memory module 12*b*. An MCD pair 100 on the memory module 12*d* receives the packet on bus 144 at the pair input 102 and transmits a packet through a loopback path 146 to the input port 102 of another MCD pair 100 on the memory module 12*d*. The other MCD pair 100 on the memory module 12*d* transmits a packet on bus 148 to the input port 102 of another MCD pair 100 on the memory module 12*b*. The other MCD pair 100 transmits a packet on bus 150 from the output port 104 to the controller 40. CH1 is interleaved with CH3 in a similar manner to how CH0 is interleaved with CH2.

Figure 12B:
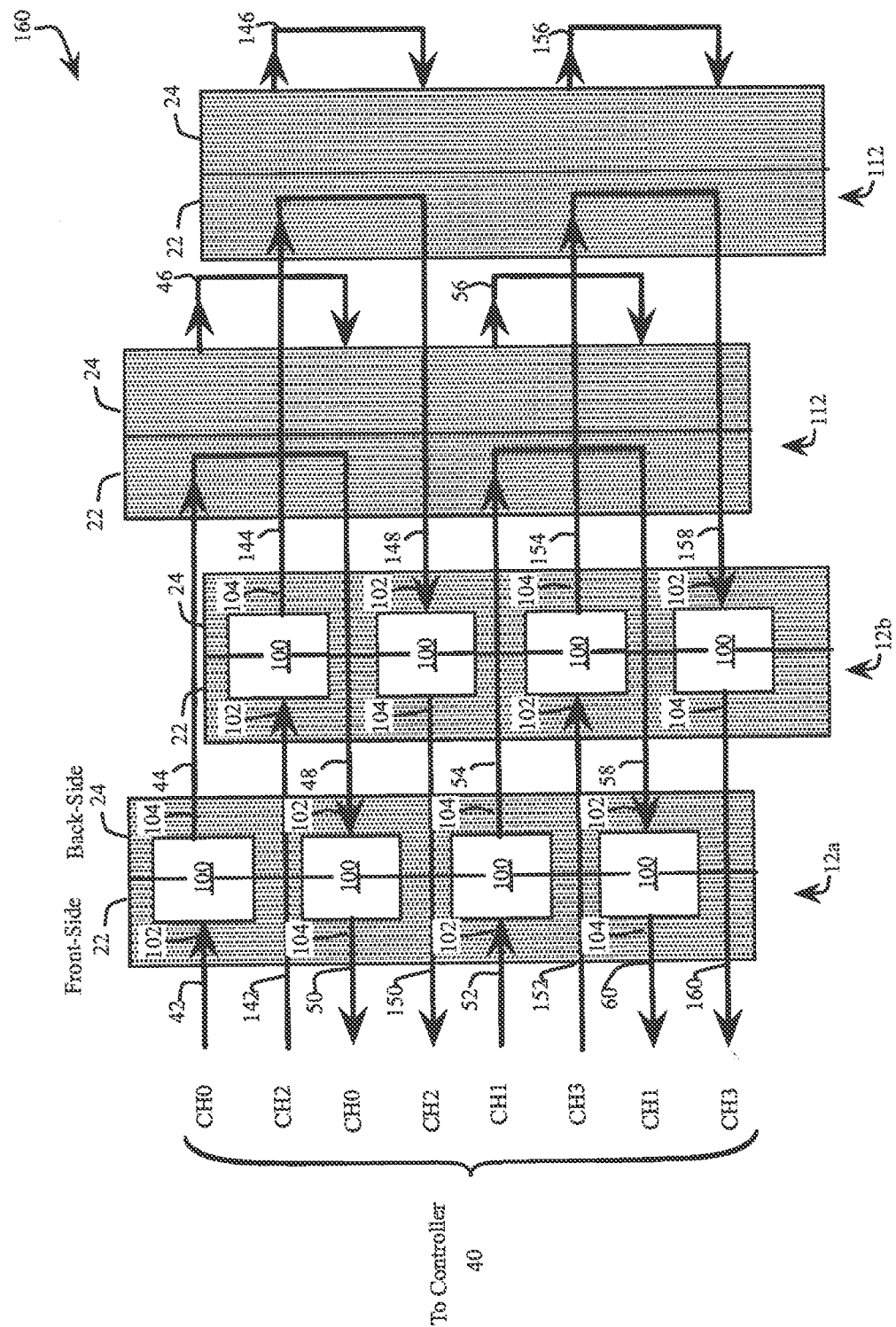

FIG. 12B shows a configurable memory subsystem 160 with the memory modules 12*c* and 12*d* of FIG. 12A each replaced by a termination module 112. The configurable memory module 160 shown in FIG. 12B reduces the memory capacity of the configurable memory module 140 shown in FIG. 12A by half and reduces the ring delay by half while retaining the same number of channels.

Figure 12C:
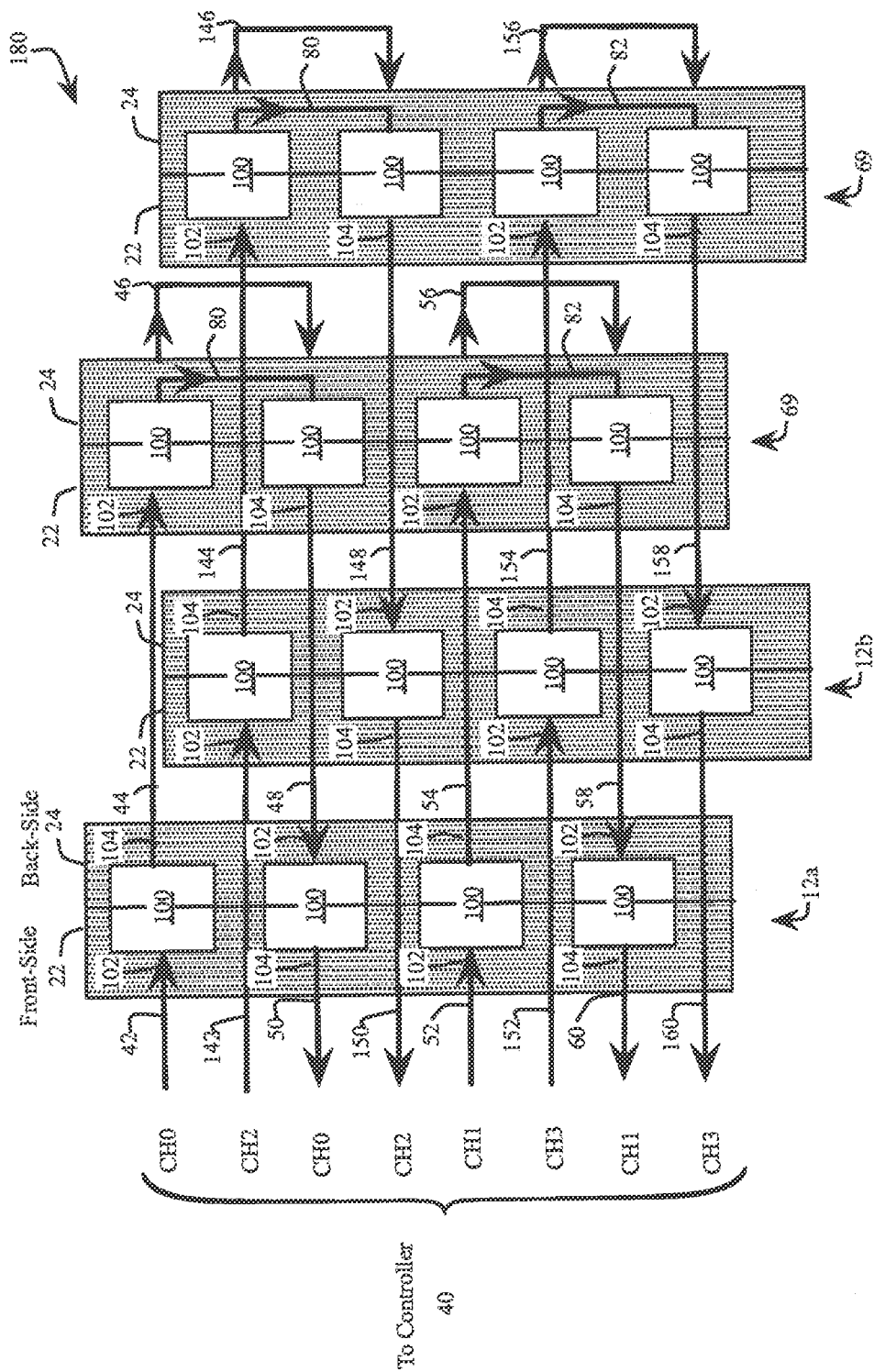

FIG. 12C shows a configurable memory subsystem 180 with the memory modules 12*c* and 12*d* of FIG. 12A each replaced by a memory module 69. The configurable memory module 180 retains the same memory capacity, ring delay and number of channels of the configurable memory module 140 shown in FIG. 12A. A user can simply reconfigure the configurable memory subsystem 180 by replacing the memory modules 12*a* and 12*b* with the memory modules 69 to reduce the memory subsystem memory capacity by half and the ring delay by half without altering the number of channels. Alternatively a user can only replace memory module 12*a* with a memory module 69 to change the characteristics of CH0 and CH1 without affecting the characteristics of CH2 and CH3.

Figure 13:
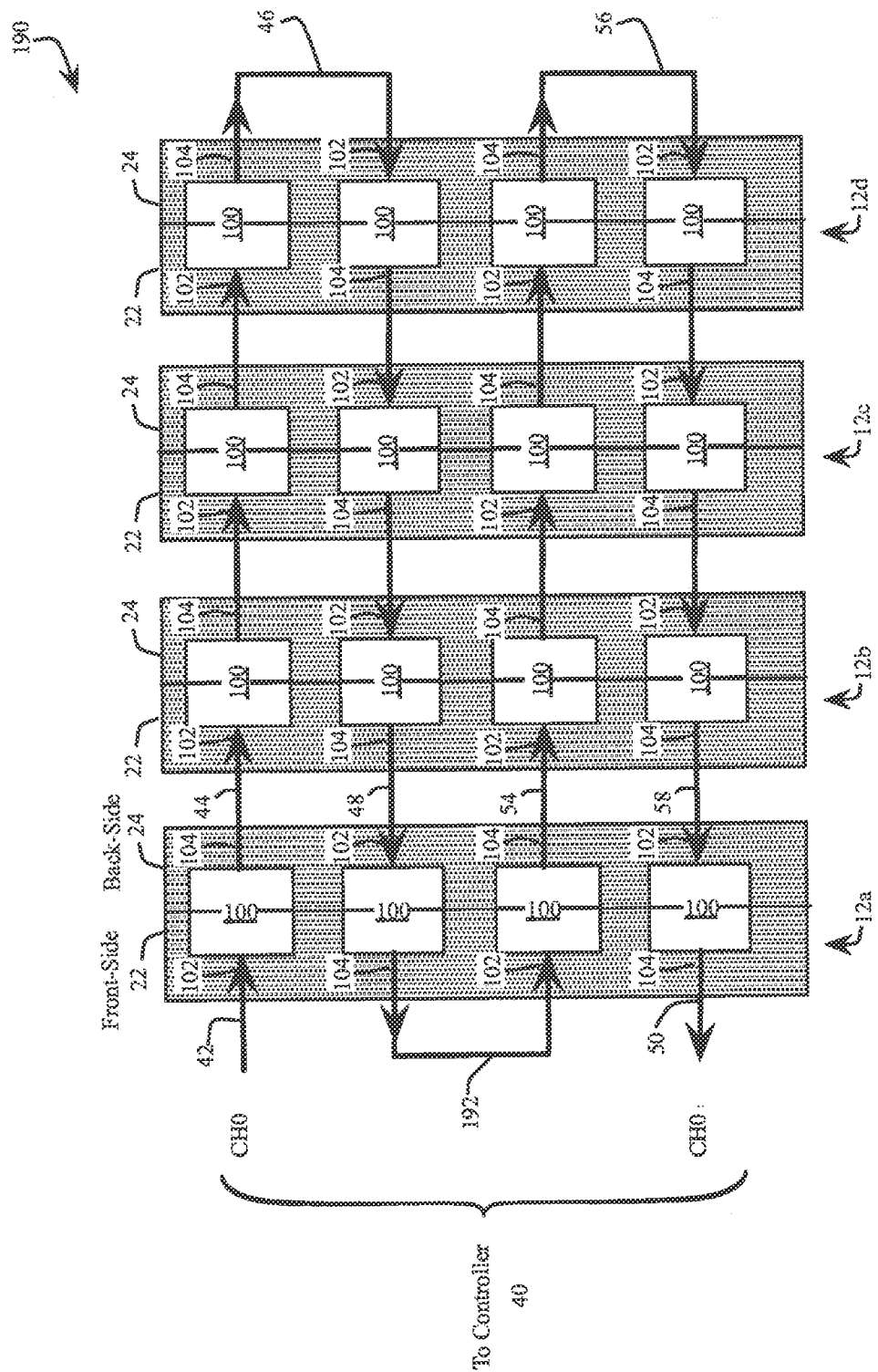
FIG. 13 illustrates an embodiment of a single-channel memory subsystem with one of three loop-back devices.

FIG. 13 shows a single-channel embodiment of a memory subsystem 190 that is a modification to the two-channel embodiment shown in FIG. 11A. Connecting an output port 104 of an MCD pair 100 on the memory module 12*a* to the input port 102 of another MCD pair 100 on the memory module 12*a*, through path 192, reconfigures the two-channel memory subsystem 10 to a single-channel memory subsystem 190. The configurable memory subsystem 190 has twice the memory capacity, twice the ring delay and half the number of channels of the memory subsystem 10 shown in FIG. 11A. The previously described modifications to the memory module 12 are applicable to the configurable memory subsystem 190.

Figure 14:
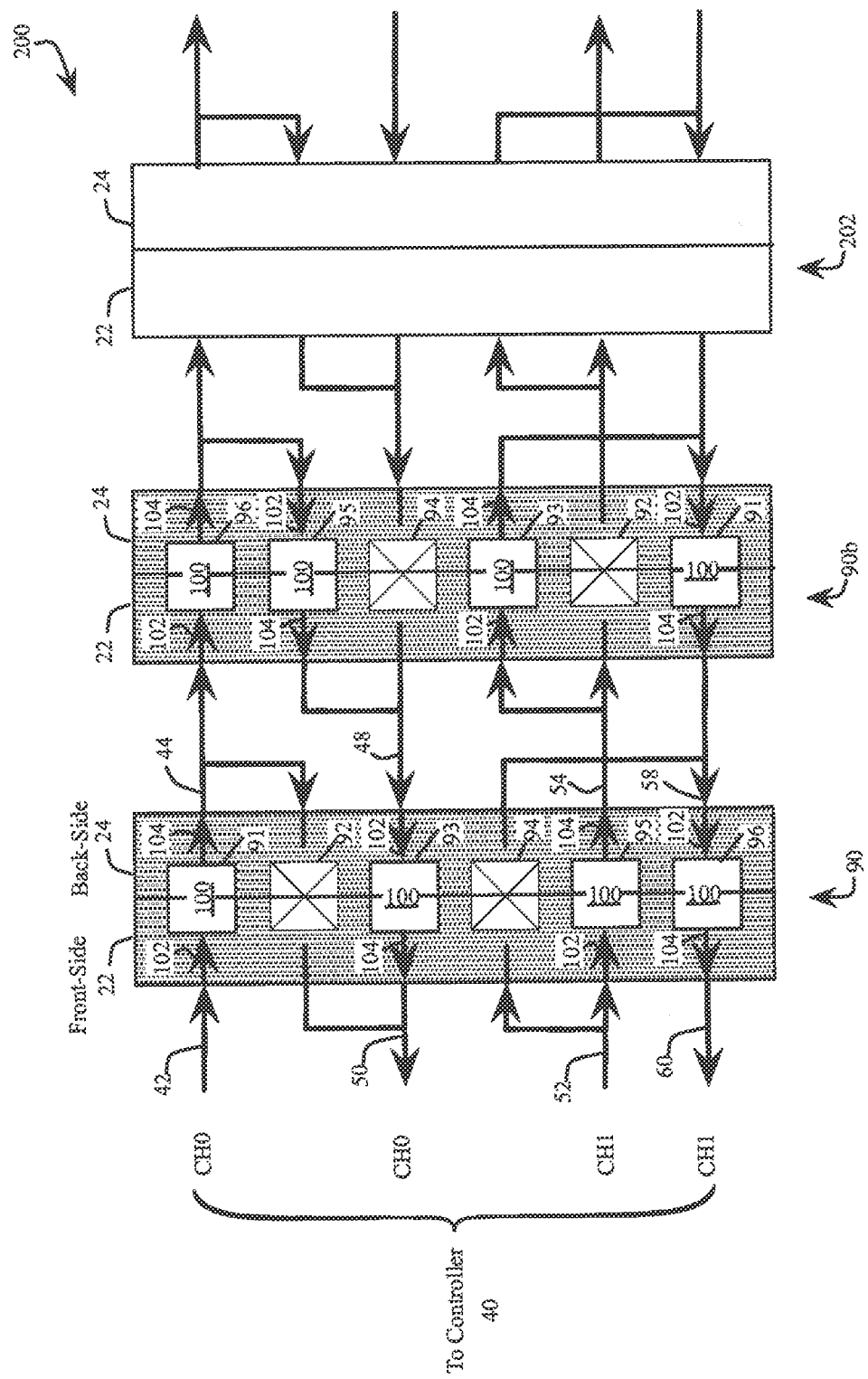
FIG. 14 illustrates an embodiment of a reversible memory subsystem showing one module in a forward position and one module in the reversed position.

FIG. 14 shows a reversible memory subsystem 200 using the reversible memory module 90 shown in FIG. 10. A full memory subsystem 200 can be implemented with only one type of memory module 90 without the need for a special termination module 112 or a memory module 69 as shown in FIGS. 12B and 12C, respectively. The memory module 90 is reversed as shown by memory module 90b to complete the loop-back of each channel.

Specifically, the channel CH0 receives a packet on bus 42 from the controller 40 at the pair input 102 of the MCD pair 100 on the memory module 90. The output port 104 of the MCD pair 100 on the memory module 90 transmits a packet on bus 44 to the input port 102 of the MCD pair 100 on the memory module 90b. The MCD pair 100 on the memory module 90b transmits a packet from the output port 104 to the input port 102 of another MCD pair 100 on the memory module 90b. The output port 104 of the other MCD pair 100 on the memory module 90b transmits a memory packet on bus 48 to the input port 102 of another MCD pair 100 on the memory module 90. The output port 104 of the other MCD pair 100 on the memory module 90 transmits a packet on bus 50 to the controller 40. The second channel CH1 follows a similar path to that described for CH0.

While the invention has been shown and described with reference to specific preferred embodiments, it should be understood by those skilled in the art that various changes in form and detail may be made therein without departing from the spirit and scope of the invention as defined by the following claims.

The invention claimed is:

1. A memory module comprising:
a plurality of devices each including an input port, an output port, a semiconductor chip and a non-volatile memory, and the semiconductor chip being configured to receive a command and a data packet on the input port and being further configured to execute, in response to the command: a transfer of a portion of the data packet from the input port to the non-volatile memory; a transfer of a portion of the data packet from the input port to the output port; or a transfer of a portion of a memory packet from the non-volatile memory to the output port; and
a circuit board including the plurality of devices mounted thereto and having a plurality of conducting paths for serial communication between a first device of the plurality of devices and a second device of the plurality of devices, the first device being on a first side of the circuit board and the second device being on a second side of the circuit board.

2. The memory module of claim 1 wherein the semiconductor chip is a bridge.

3. The memory module of claim 1 wherein each of the plurality of devices is a stacked multi-chip device with the non-volatile memory contained in a separate memory chip.

4. The memory module of claim 1 wherein each of the plurality of devices is a monolithic device.

5. The memory module of claim 1 wherein the input port of the first device is communicatively coupled with a plurality of input conductors on an edge of the circuit board, the output port of the first device is communicatively coupled with the input port of the second device, the output port of the first device and the input port of the second device are aligned to each other to reduce a communication path therebetween, and the output port of the second device is communicatively coupled with a plurality of output conductors on the edge of the circuit board.

6. The memory module of claim 1 wherein the output port of the first device is communicatively coupled with the input port of the second device and a bus order of the output port of the first device is reversed from a bus order of the input port of the second device.

7. The memory module of claim 1 wherein a third device of the plurality of devices is on the first side of the circuit board, and the first and third devices are collinear to each other.

8. The memory module of claim 1 wherein the circuit board includes an edge connector configured to attach the circuit board to another circuit board and providing a communication path therebetween.

9. The memory module of claim 1 wherein the plurality of devices includes a first pair of devices comprised of the first device and the second device, and a second pair of devices comprised of a third device and a fourth device, a pair input of the first pair being in communication with the input port of the first device, the output port of the first device being in communication with the input port of the second device, and the output port of the second device being in communication with a pair output of the first pair,
the pair input of the first pair being in communication with a plurality of input conductors on an edge of the circuit board, the pair output of the first pair being in communication with the pair input of the second pair and the pair output of the second pair being in communication with a plurality of output conductors on the edge of the circuit board.

10. The memory module of claim 1 wherein the circuit board is divided into an upper half and a lower half, each of the halves including a plurality of pairs of devices mounted thereto, each of the pairs comprising an input port of one of the pair adapted to receive a packet, an output port of the one of the pair in communication with an input port of a second of the pair and an output port of the second of the pair adapted to transmit the packet,
the upper half having an outer pair and an inner pair each being disposed adjacently to a same unpopulated pair mounting location, and
the lower half having an outer pair disposed adjacently to an inner pair, the inner pair disposed adjacently to an unpopulated pair mounting location adjacent to the upper half.

11. The memory module of claim 1 wherein the non-volatile memory is flash memory.

12. The memory module of claim 11 wherein the flash memory is NAND flash memory.

* * * * *